US011682597B2

(12) United States Patent
Nomura et al.

(10) Patent No.: US 11,682,597 B2
(45) Date of Patent: Jun. 20, 2023

(54) MODULE WITH BUILT-IN COMPONENT AND METHOD FOR MANUFACTURING THE SAME

(71) Applicant: Murata Manufacturing Co., Ltd., Kyoto (JP)

(72) Inventors: Tadashi Nomura, Kyoto (JP);
Shinichiro Banba, Kyoto (JP);
Tsuyoshi Takakura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 188 days.

(21) Appl. No.: 16/923,211

(22) Filed: Jul. 8, 2020

(65) Prior Publication Data

US 2020/0343151 A1    Oct. 29, 2020

Related U.S. Application Data

(63) Continuation of application No. PCT/JP2018/047997, filed on Dec. 27, 2018.

(30) Foreign Application Priority Data

Jan. 11, 2018  (JP) .............................. JP2018-002371

(51) Int. Cl.
*H01L 23/12*    (2006.01)
*H01L 21/48*    (2006.01)
(Continued)

(52) U.S. Cl.
CPC .......... *H01L 23/12* (2013.01); *H01L 21/4846* (2013.01); *H01L 21/56* (2013.01);
(Continued)

(58) Field of Classification Search
CPC ... H01L 25/16; H01L 21/56; H01L 23/49811; H01L 23/3121; H01L 25/04;
(Continued)

(56) References Cited

U.S. PATENT DOCUMENTS 11,211,358 B2 * 12/2021  Tang ....................... H01L 25/50
2012/0139089 A1  6/2012  Huang et al.
(Continued)

FOREIGN PATENT DOCUMENTS

JP         H07230837 A     8/1995
JP         2002217514 A    8/2002
(Continued)

OTHER PUBLICATIONS

International Search Report issued in Application No. PCT/JP2018/047997, dated Mar. 5, 2019.
(Continued)

*Primary Examiner* — Alexander O Williams
(74) *Attorney, Agent, or Firm* — Pearne & Gordon LLP

(57) ABSTRACT

A module includes components on an upper surface and a lower surface of a substrate, a second sealing resin layer laminated on the upper surface of the substrate, a first sealing resin layer on the lower surface of the substrate, and terminal blocks on the lower surface of the substrate. Each of the terminal blocks is formed by integrating a plurality of connection conductors, each of the plurality of connection conductors including a terminal portion and a substrate connecting portion formed by bending an end portion of the connection conductor, and each of the terminal blocks forms an external connection terminal of the module or functions as a shield wall for the components. Each of the terminal blocks 6 can be formed by mounting a terminal assembly onto the lower surface of the substrate, sealing the terminal assembly with a resin, and removing connecting portions.

18 Claims, 18 Drawing Sheets

(51) Int. Cl.
  *H01L 21/56*   (2006.01)
  *H01L 23/31*   (2006.01)
  *H01L 23/552*  (2006.01)
  *H01L 25/04*   (2023.01)
  *H01L 25/16*   (2023.01)

(52) U.S. Cl.
  CPC ........ *H01L 23/3121* (2013.01); *H01L 23/552* (2013.01); *H01L 25/04* (2013.01); *H01L 25/16* (2013.01)

(58) Field of Classification Search
  CPC ... H01L 23/552; H01L 23/12; H01L 21/4846; H01L 2924/19105; H01L 2224/16225; H01L 2924/181; H01L 2924/00012
  USPC ........................................................ 257/734
  See application file for complete search history.

(56) References Cited

U.S. PATENT DOCUMENTS

| | | | |
|---|---|---|---|
| 2012/0320536 A1 | | 12/2012 | Yamamoto |
| 2012/0320559 A1 | | 12/2012 | Kimura |
| 2017/0033039 A1 | | 2/2017 | Lee et al. |
| 2019/0074267 A1 | * | 3/2019 | Yang ..................... H01L 21/561 |
| 2019/0326256 A1 | * | 10/2019 | Chang ................. H01L 23/5385 |
| 2021/0225776 A1 | * | 7/2021 | Wu ......................... H01L 25/16 |

FOREIGN PATENT DOCUMENTS

| | | | | | |
|---|---|---|---|---|---|
| JP | 2006-196857 | A | * | 7/2006 | ............. H01L 24/97 |
| JP | 2012028486 | A | * | 2/2012 | ............. H01L 24/97 |
| JP | 5510461 | B2 | | 6/2014 | |
| JP | 5708814 | B2 | | 4/2015 | |
| WO | 2007132612 | A1 | | 11/2007 | |
| WO | 2011111318 | A1 | | 9/2011 | |
| WO | 2013035716 | A1 | | 3/2013 | |
| WO | 2019045088 | A1 | * | 3/2019 | ............. H01L 23/00 |

OTHER PUBLICATIONS

Written Opinion issued in Application No. PCT/JP2018/047997, dated Mar. 5, 2019.

* cited by examiner

MODULE WITH BUILT-IN COMPONENT AND METHOD FOR MANUFACTURING THE SAME

This is a continuation of International Application No. PCT/JP2018/047997 filed on Dec. 27, 2018 which claims priority from Japanese Patent Application No. 2018-002371 filed on Jan. 11, 2018. The contents of these applications are incorporated herein by reference in their entireties.

BACKGROUND

Technical Field

The present disclosure relates to a module with a built-in component and a method for manufacturing the module with a built-in component.

In the related art, as described in Patent Document 1, there has been proposed a method for manufacturing, at a low cost and in a short manufacturing time, a module that includes an interlayer connection conductor by mounting a terminal assembly, which includes a plurality of connection terminals connected to one another by a connecting portion, onto a wiring board and then removing the connecting portion after performing resin sealing. For example, as illustrated in FIG. 18A, a metal plate that includes a plurality of terminals 101 and a rectangular connecting portion 102 having two opposite sides to which the terminals 101 are connected is prepared, and a terminal assembly 100 is formed by bending this metal plate as illustrated in FIG. 18B. The terminal assembly 100 and another electronic component are mounted onto one main surface of a substrate, and a sealing resin layer is formed so as to seal the terminal assembly 100 and the electronic component. Then, the connecting portion 102 is removed when a surface of the sealing resin layer is polished, so that an interlayer connection conductor can be formed from the terminal assembly 100.

By forming the interlayer connection conductor in the manner described above, there is no need to form a via hole, which is formed through a plurality of complicated steps, and a reduction in the manufacturing costs and the manufacturing time of the module can be achieved. In addition, a plurality of interlayer connection conductors can be formed at a time by only mounting the terminal assembly 100 onto the one main surface of the substrate.

Patent Document 1: Japanese Patent No. 5708814 (see [0021]-[0030] and FIG. 1)

BRIEF SUMMARY

However, when the above-described terminal assembly 100 is mounted onto the substrate, the connection area between the terminals 101 and the substrate is small, and thus, there is a possibility that the connection between the terminal assembly 100 and the substrate will become unstable, which in turn results in a decrease in the reliability of the module. In addition, after the terminal assembly 100 has been mounted on the substrate, and the connecting portion 102 has been removed, there is a possibility that the terminals 101 will come off the sealing resin layer.

The present disclosure provides a module capable of improving the reliability of the module by increasing the connection area between a substrate and terminal portions and in which the terminal portions are prevented from coming off a sealing resin layer.

A module according to the present disclosure includes a substrate, a component and a connection conductor that are mounted on a first main surface of the substrate, and a first sealing resin layer that covers the first main surface, the component, and the connection conductor. The connection conductor includes a terminal portion that is vertically arranged in the first sealing resin layer and a substrate connecting portion that is formed by bending an end portion of the connection conductor. The terminal portion has an end portion that is exposed at a surface of the first sealing resin layer, and the substrate connecting portion is connected to the first main surface of the substrate.

According to this configuration, since the connection conductor includes the substrate connecting portion, which is formed by bending an end portion thereof, the connection area between the connection conductor and the substrate can be increased, and the connection reliability between the connection conductor and the substrate can be improved. In addition, providing the substrate connecting portion can prevent the connection conductor from coming off the first sealing resin layer.

The end portion of the terminal portion of the connection conductor may form an external connection terminal. According to this configuration, the terminal portion can be used as an external connection terminal, and thus, there is no need to additionally form a via hole. Consequently, the manufacturing costs can be reduced, and a reduction in the manufacturing time can be achieved.

A shield film may be formed on the surface of the first sealing resin layer, and the end portion of the terminal portion may be connected to the shield film. According to this configuration, by connecting the terminal portion to the shield film, the terminal portion can be used as a shield wall for the component in the module.

In addition, even if the module is increased in size or becomes complex, or the module has a large number of terminals, forming the terminal blocks can facilitate the mounting of the connection conductor onto the substrate, and the probability of a connection failure occurring due to positional deviation can be reduced, which in turn results in an improvement in the reliability of terminal connection. According to this configuration, the terminal blocks can be combined and easily mounted onto the substrate, and thus, a module that is favorable in terms of mass production can be provided. In addition, even if the module is increased in size or becomes complex, or the module has a large number of terminals, forming the terminal blocks can facilitate the mounting of the connection conductor onto the substrate, and the probability of a connection failure occurring due to positional deviation can be reduced, which in turn results in an improvement in the reliability of terminal connection.

The plurality of connection conductors, which are integrated with one another by the terminal block, may have the terminal portions that are adjacent to each other and that are connected to each other by a planar conductor. According to this configuration, a shield wall can be easily formed inside the substrate.

A plurality of the terminal blocks may be arranged so as to surround the component. According to this configuration, a shield wall for the component placed inside the substrate can be easily formed. In addition, the module may further include a component that is mounted on a second main surface of the substrate and a second sealing resin layer that covers the second main surface and the component.

The module may further include another connection conductor that is mounted, together with another component, on the second main surface of the substrate, and a second sealing resin layer that covers the second main surface, the other component, and the other connection conductor. The other connection conductor may include a terminal portion that is vertically arranged in the second sealing resin layer and a substrate connecting portion that is formed by bending an end portion the other connection conductor. The terminal portion may have an end portion that is exposed at a surface of the second sealing resin layer, and the substrate connecting portion may be connected to the second main surface of the substrate. The end portion of the terminal portion of the connection conductor mounted on the first main surface and the end portion of the terminal portion of the other connection conductor mounted on the second main surface may each form an external connection terminal.

According to this configuration, a shield wall can be partially formed also in the case where components are mounted on the two surfaces of the substrate. In addition, another end of each of the terminal portions, which are exposed at the top and bottom of the module, forms an external connection terminal, and thus, double-sided mount modules can be stacked one on top of the other.

The module may further include the component and another connection conductor that are mounted on a second main surface of the substrate, a second sealing resin layer that covers the second main surface, the component, and the other connection conductor, and a shield film that is formed on a surface of the first sealing resin layer and a surface of the second sealing resin layer. The other connection conductor may include a terminal portion that is vertically arranged in the second sealing resin layer and a substrate connecting portion that is formed by bending an end portion the other connection conductor. The terminal portion may have an end portion that is exposed at the surface of the second sealing resin layer, and the substrate connecting portion may be connected to the second main surface of the substrate. The terminal portion of one of the connection conductor mounted on the first main surface and the other connection conductor mounted on the second main surface may have the end portion that forms an external connection terminal, and the terminal portion of another one of the connection conductor and the other connection conductor may have the end portion that is connected to the shield film.

According to this configuration, a shield wall can be partially formed on both the first and second main surfaces of the substrate.

A method for manufacturing a module with a built-in component according to the present disclosure includes a terminal assembly formation step of forming a terminal assembly in which a plurality of metal members are arranged and integrated with one another by a resin, each of the plurality of metal members including a pair of terminal portions, a substrate connecting portion formed by bending an end portion of the metal member, and a connecting portion connecting end portions of the pair of terminal portions that are not bent, a mounting step of mounting the terminal assembly and a component onto a first main surface of a substrate, a resin layer formation step of forming a sealing resin layer that covers the first main surface of the substrate, the terminal assembly, and the component, and a polishing step of removing the connecting portions included in the terminal assembly by polishing a surface of the sealing resin layer. The terminal assembly formation step includes a lead frame preparation step of preparing a lead frame that includes a pair of frame portions and a plurality of lead portions supported by the pair of frame portions, a metal member formation step of forming the plurality of metal members that include the substrate connecting portions and the connecting portions by bending the lead portions of the lead frame, a resin sealing step of sealing the plurality of metal members, which are supported by the frame portions, with a resin, a frame cutting step of cutting and removing the frame portions, and a singulation step of cutting and singulating the plurality of metal members sealed with the resin.

According to this configuration, the connection area between the substrate and the connection conductor can be increased, and thus, the reliability of the module can be improved. In addition, the terminal portions can be prevented from coming off the sealing resin layer. By combining the terminal assemblies that are prepared as standard products and mounting them, the same and simple processing step can be applied to a plurality of types of module with a built-in component. In addition, the processing step can be simplified by mounting the terminal assemblies on the substrate. Furthermore, the step of providing a shield inside the substrate can be simplified, and the manufacturing costs can be reduced.

According to the present disclosure, a module that is favorable in terms of mass production and in which an external connection terminal or a shield wall can be formed through a simple processing step can be provided. In addition, even if the size of the module itself increases, or the module has a large number of terminals, by including a terminal block that is easy to handle in the module, positional deviation can be prevented, and the reliability of terminal connection can be improved.

DETAILED DESCRIPTION

First Embodiment

A module 1 according to a first embodiment of the present disclosure will be described with reference to FIG. 1A to FIG. 3C. Note that FIG. 1A and FIG. 1B are respectively a plan view of the module 1 according to the first embodiment when viewed from a mounting surface side and a sectional view of the module 1 taken along line A-A of FIG. 1A, and FIGS. 2A-2D and FIGS. 3A-3C are diagrams each illustrating an example of a terminal block that is mounted on the module 1.

Figure 1A:
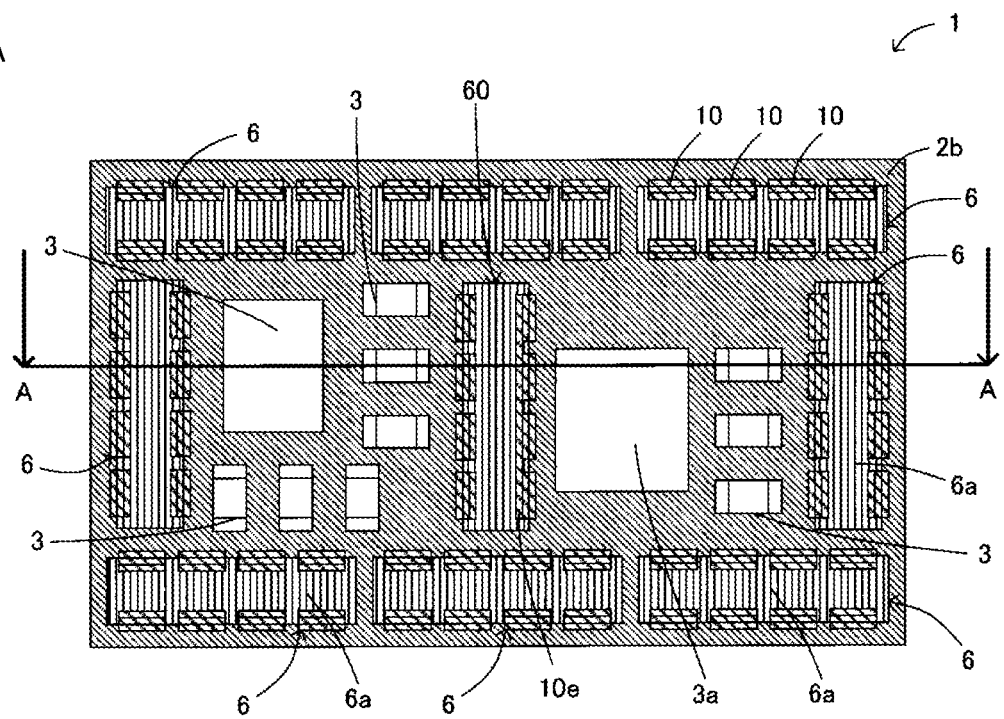
FIG. 1A includes a plan view and FIG. 1B includes a sectional view of a module according to a first embodiment of the present disclosure.
Figure 1B:
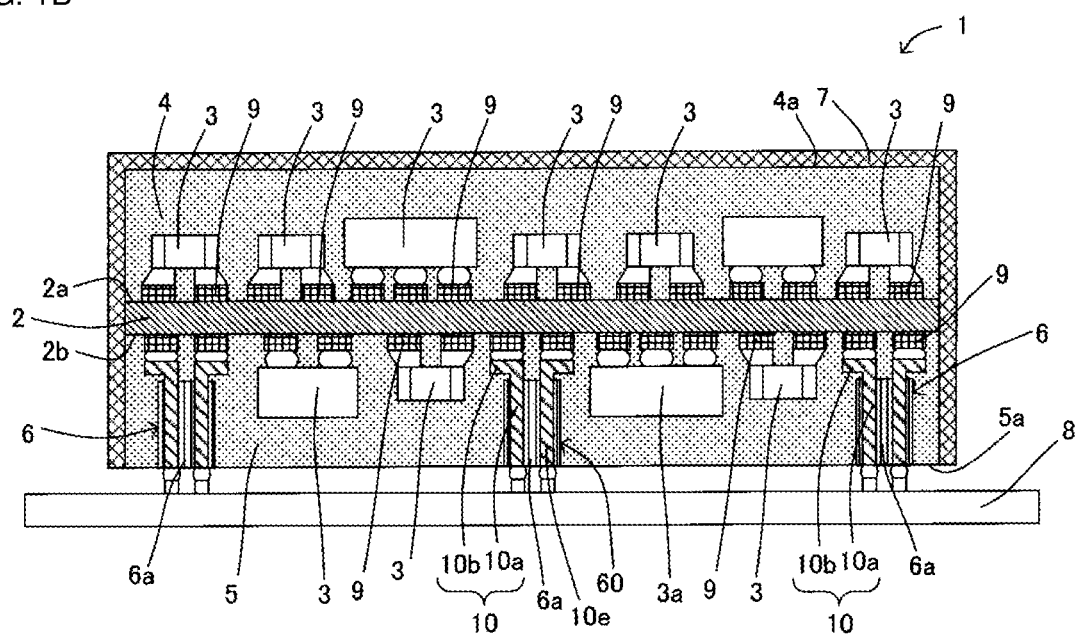

As illustrated in FIGS. 1A and 1B, the module 1 according to the first embodiment includes a substrate 2 that has an upper surface 2a (corresponding to "a second surface" of the present disclosure) and a lower surface 2b (corresponding to "a first surface" of the present disclosure) on each of which a plurality of components 3 are mounted, the substrate 2 including a second sealing resin layer 4 laminated on the upper surface 2a and a first sealing resin layer 5 laminated on the lower surface 2b, a plurality of terminal blocks 6 that are mounted on the lower surface 2b of the substrate 2, and a shield film 7 that covers a side surface and an upper surface 4a of the second sealing resin layer 4, a side surface of the first sealing resin layer 5, and a side surface of the substrate 2. For example, the module 1 is to be mounted on a mother substrate 8 of an electronic device.

The substrate 2 is made of, for example, a low-temperature co-fired ceramic, a glass epoxy resin, or the like. A plurality of land electrodes 9 are formed on the upper surface 2a and the lower surface 2b of the substrate 2, and a plurality of ground electrodes (not illustrated), a plurality of wiring electrodes (not illustrated), a plurality of via conductors (not illustrated), and so forth are formed on or in outer and inner layers of the substrate 2. Note that each of the ground electrodes is formed so as to exposed at, for example, the side surface of the substrate 2.

The land electrodes 9, the ground electrodes, and the wiring electrodes are each made of a metal, such as Cu, Ag, or Al that is generally used as an electrode. In addition, each of the via conductors is made of a metal, such as Ag, Cu, or the like.

Examples of the components 3 include components, such as inductors, capacitors, ICs, and power amplifiers. The components 3 are mounted on the upper surface 2a and the lower surface 2b of the substrate 2 as a result of connection terminals (not illustrated) of the components 3 being connected to the land electrodes 9, which are formed on the upper surface 2a and the lower surface 2b of the substrate 2, with solder.

The second sealing resin layer 4 is provided on the upper surface 2a of the substrate 2 so as to cover the upper surface 2a of the substrate 2 and the components 3, and the first sealing resin layer 5 is provided on the lower surface 2b of the substrate 2 so as to cover the lower surface 2b of the substrate 2, the components 3, and the terminal blocks 6. These sealing resin layers 4 and 5 can be made of a resin, such as an epoxy resin containing silica filler that is generally used as a sealing resin. Alternatively, a filler, such as alumina filler that has a high thermal conductivity may be used for obtaining a high thermal conductivity.

The shield film 7 shields each of the components 3 against radio waves from the outside and is connected to the ground electrodes of the substrate 2. The shield film 7 can be formed in a multi-layer structure that includes a close-contact layer, an electroconductive film laminated on the close-contact layer, and a protective film laminated on the electroconductive film. The close-contact layer can be made of, for example, a metallic material, such as SUS. Alternatively, the close-contact layer may be made of Ti, Cr, Ni, TiAl, or the like. The electroconductive film is a layer that serves a substantial shielding function of the shield film 7 and can be made of, for example, one of metals including Cu, Ag, and Al. The protective film is provided in order to prevent corrosion of the electroconductive film and formation of scratches on the electroconductive film and can be made of, for example, SUS. Note that the protective film may be made of Ti, Cr, Ni, TiAl, or the like.

Each of the terminal blocks 6 includes a plurality of connection conductors 10 that are arranged in one or two rows and integrated with one another by a resin 6a. Each of the connection conductors 10 is a plate-shaped conductor that is formed in an L shape and that includes terminal portions 10a and substrate connecting portions 10b, which are formed by bending one end of each of the connection conductors. In the present embodiment, each of the terminal blocks 6 includes eight connection conductors 10 that are arranged in two rows and integrated with one another by the resin 6a. Note that the substrate connecting portions 10b in each row are formed by bending one end of each of the connecting conductors toward the outside of the terminal block 6. In addition, an end portion of each of the terminal portions 10a is exposed at a lower surface 5a of the first sealing resin layer 5 and forms an external connection terminal, and each of the substrate connecting portions 10b is connected to one of the land electrodes 9, which are formed on the lower surface 2b of the substrate 2. A terminal block 60 that is one of the terminal blocks 6 mounted on the lower surface 2b of the substrate 2 and in which adjacent terminal portions 10a are connected to one another by a planar conductor also functions as a shield wall for a component 3a that is mounted on the lower surface 2b of the substrate 2.

Each of the terminal blocks 6 can be formed by mounting a terminal assembly 11, such as that illustrated in FIGS. 2A-2D or FIGS. 3A-3C onto the lower surface 2b of the substrate 2, laminating the first sealing resin layer 5 thereon, performing a step, such as polishing or grinding, and removing connecting portions 10c, which connect the terminal portions 10a to each other. Note that details of a method for manufacturing the terminal assemblies 11 and details of a method for forming the terminal blocks 6 after the terminal assemblies 11 have been mounted on the substrate 2 will be described later.

Figure 2A:
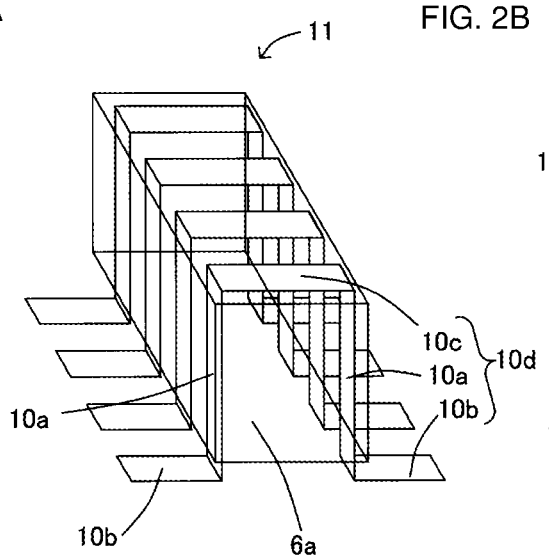
FIGS. 2A, 2B, 2C, and 2D are diagrams illustrating an example of a terminal assembly of the module illustrated in FIGS. 1A and 1B.
Figure 2B:
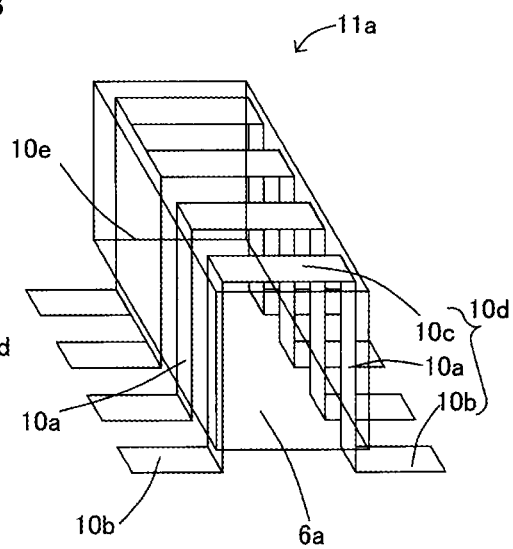
Figure 2C:
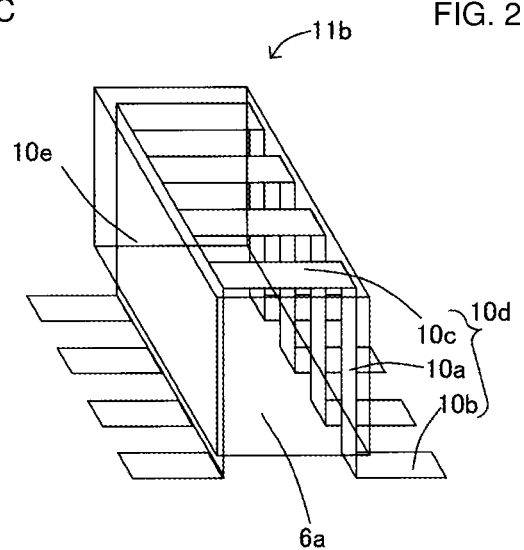
Figure 2D:
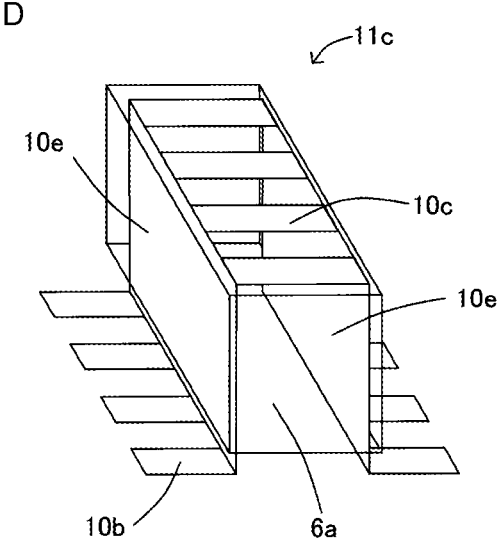
Figure 3A:
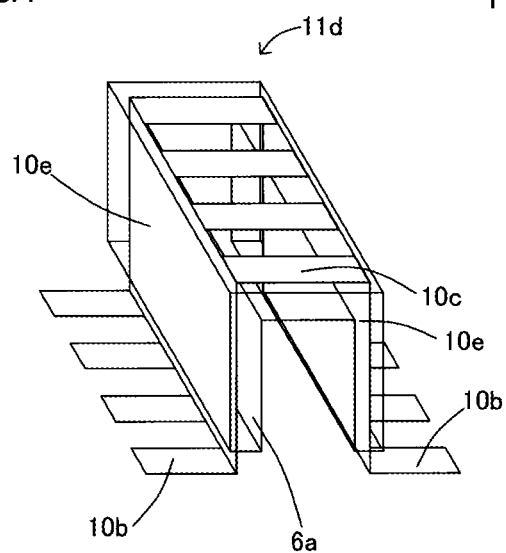
FIGS. 3A, 3B, and 3C are diagrams illustrating another example of the terminal assembly illustrated in FIGS. 1A and 1B.
Figure 3B:
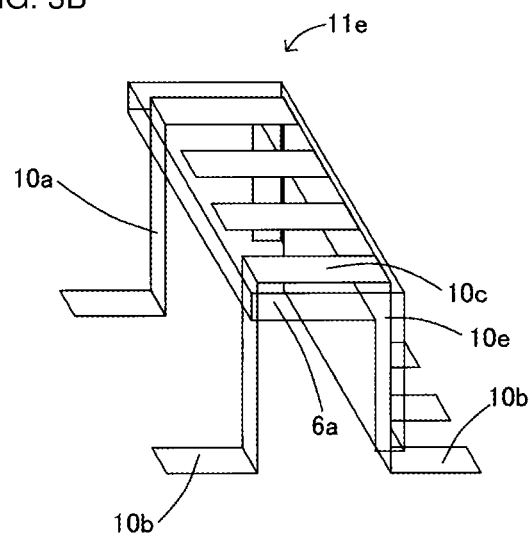
Figure 3C:
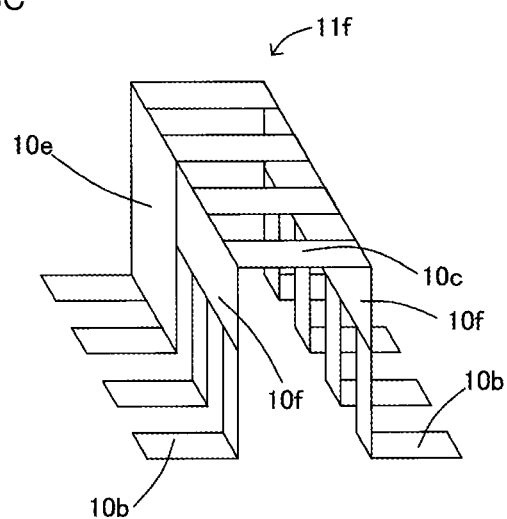

Here, various shapes of the terminal assemblies 11 will be described with reference to FIGS. 2A-2D and FIGS. 3A-3C. Each of the terminal assemblies 11 can be prepared in various shapes by presetting, for example, the number of terminals, the thickness of each terminal, the width of each terminal, the height of each terminal, the pitch of the terminals, and the like as standards. In the terminal assembly 11 that is illustrated in FIG. 2A, the terminal portions 10a are arranged in two rows, and each of the connecting portions 10c connects one of the terminal portions 10a in the first row and one of the terminal portions 10a in the second row that face each other. An end portion of each of the terminal portions 10a, the end portion being opposite to an end portion of the terminal portion 10a that faces the corresponding connecting portions 10c, is bent, so that the substrate connecting portion 10b is formed. The terminal assembly 11 has a structure in which a plurality of metal plates 10d, each of which is formed by connecting two of the terminal portions 10a to each other by one of the connecting portions 10c, is integrated with one another by being covered with the resin 6a. A terminal assembly 11a that is illustrated in FIG. 2B has a shape in which some of the terminal portions 10a in the first row that are adjacent to each other are connected to each other by a shield wall 10e. In a terminal assembly 11b that is illustrated in FIG. 2C, the shield wall 10e is formed in the first row, and the second row is formed of only the terminal portions 10a. In a terminal assembly 11c that is illustrated in FIG. 2D, the shield wall 10e is formed also in the second row. In a terminal assembly 11d that is illustrated in FIG. 3A, the resin portion that is surrounded by the shield walls 10e and the connecting portions 10c is removed, and thus, for example, the terminal assembly 11d can be mounted on the lower surface 2b of the substrate 2 so as to extend across one of the components 3. In a terminal assembly 11e that is illustrated in FIG. 3B, some of the terminal portions 10a in the first row are removed, and the shield wall 10e is formed in the second row. As in a terminal assembly 11f that is illustrated in FIG. 3C, only upper portions of the adjacent terminal portions 10a may be connected to each other by a planar conductor so as to form a side-surface connecting portion 10f. The side-surface connecting portion 10f can be used as a reference for polishing that is performed when the connecting portions 10c are removed.

(Method for Manufacturing Terminal Assembly)

A method for manufacturing the terminal assembly 11 will be described with reference to FIG. 4A to FIG. 6.

Figure 4A:
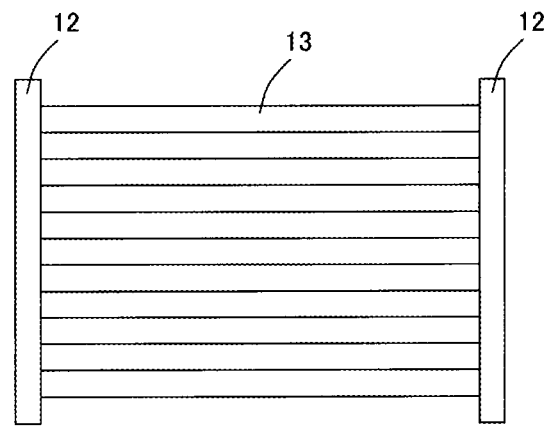
FIGS. 4A and 4B are diagrams illustrating a method for manufacturing the terminal assembly illustrated in FIGS. 2A-2D.
Figure 4B:
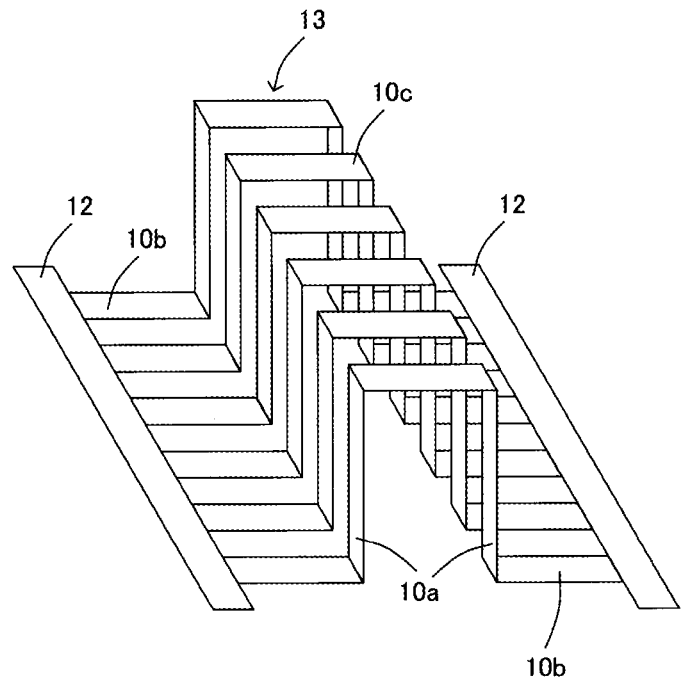
Figure 5A:
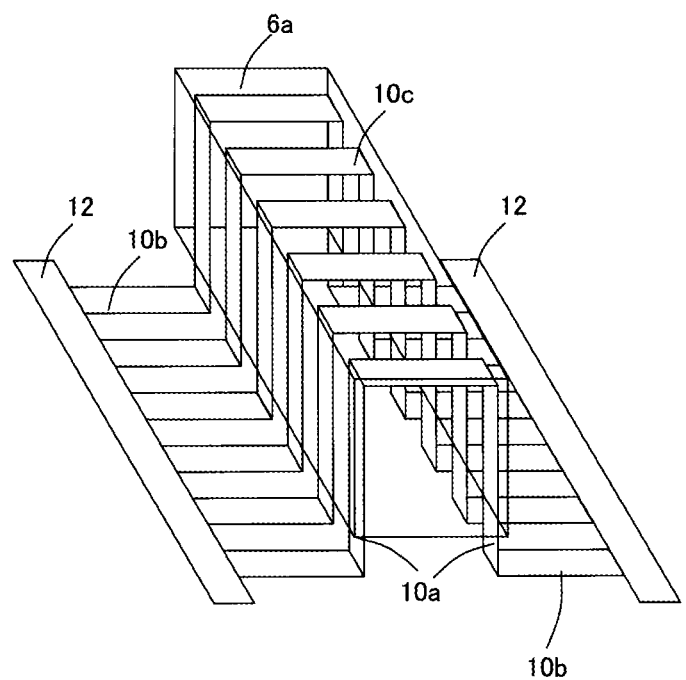
FIGS. 5A and 5B are diagrams illustrating the method for manufacturing the terminal assembly illustrated in FIGS. 2A-2D.

As illustrated in FIG. 4A, a lead frame that includes a pair of frame portions 12 and a plurality of lead portions 13 that are supported by the frame portions 12 is prepared. Next, as illustrated in FIG. 4B, the lead frame is bent so as to form portions that serve as the terminal portions 10a, the substrate connecting portions 10b, and the connecting portions 10c. Then, as illustrated in FIG. 5A, the portions of the bent lead frame that serve as the terminal portions 10a and the connecting portions 10c are sealed with the resin 6a. Here, the resin 6a can be made of a resin, such as an epoxy resin containing silica filler that is generally used as a sealing resin. Alternatively, a filler, such as alumina filler that has a high thermal conductivity may be used for obtaining a high thermal conductivity.

Figure 5B:
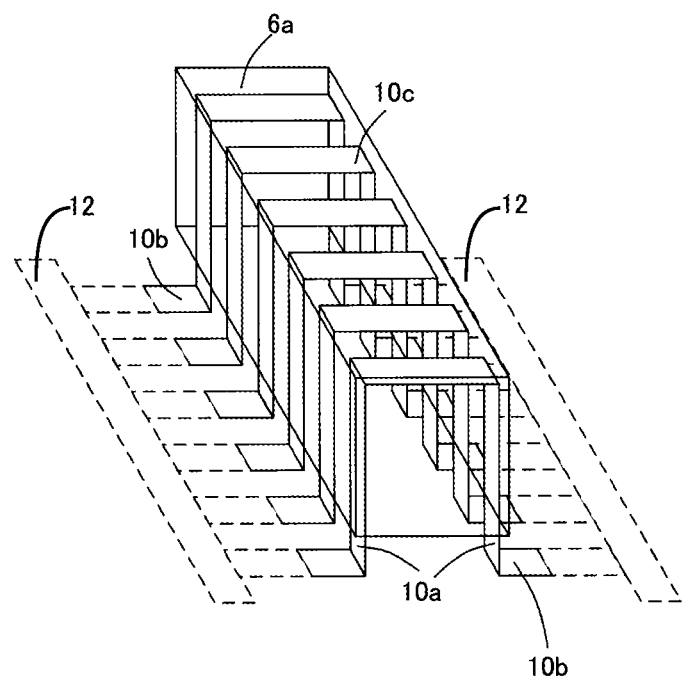
Figure 6:
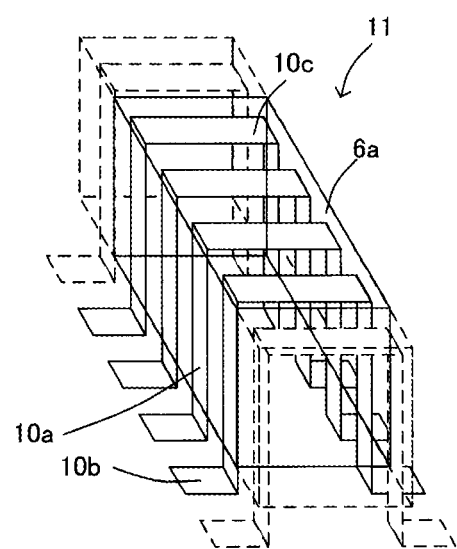
FIG. 6 is a diagram illustrating the method for manufacturing the terminal assembly illustrated in FIGS. 2A-2D.

Next, as illustrated in FIG. 5B, the frame portions 12 are cut off. Finally, as illustrated in FIG. 6, the lead frame is cut to obtain a piece having a predetermined length, so that manufacture of the terminal assembly 11 is completed.

(Method for Manufacturing Module)

A method for manufacturing a module that uses the terminal assemblies 11 will now be described with reference to FIGS. 7A-7B and FIGS. 8A-8B. In the first embodiment, an aggregate of a plurality of modules 1 is formed and then separated into pieces, so that the modules 1 are manufactured. Note that, the components 3, which are mounted on the upper surface 2a of the substrate 2, and the second sealing resin layer 4 are not illustrated in FIGS. 7A-7B and FIGS. 8A-8B.

Figure 7A:
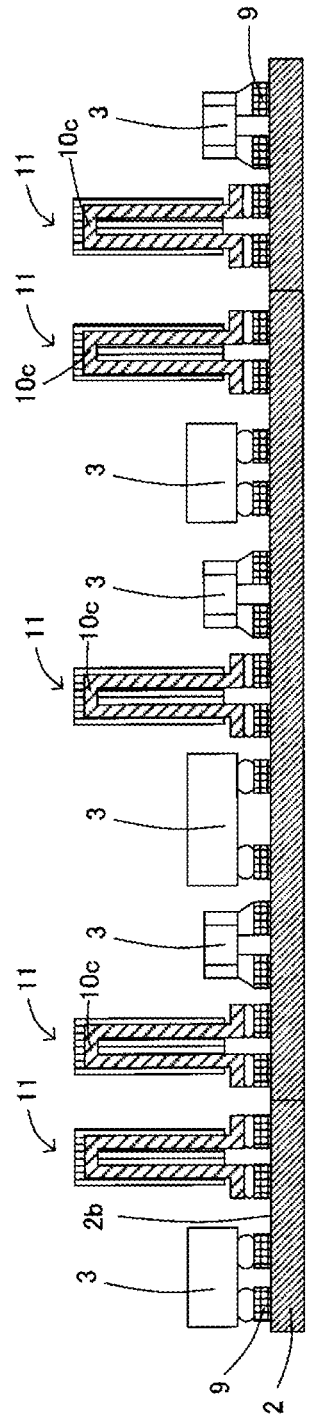
FIGS. 7A and 7B are diagrams illustrating a method for manufacturing the module illustrated in FIGS. 1A and 1B.

First, as illustrated in FIG. 7A, the substrate 2 that has the upper surface 2a and the lower surface 2b, on which the plurality of land electrodes 9 have been formed, and the outer and inner layers, on or in which a plurality of ground electrodes, a plurality of wiring electrodes, a plurality of via conductors, and so forth have been formed, is prepared. The land electrodes 9, the ground electrodes, and the wiring electrodes can each be formed by performing screen-printing using an electrically conductive paste containing a metal, such as Cu, Ag, or Al. Each of the via conductors can be formed by a commonly known method after forming a via hole with a laser or the like. Then, the components 3 are mounted on the upper surface 2a of the substrate 2, and the components 3 and the terminal assemblies 11 are mounted on the lower surface 2b by a commonly known surface mount technology. For example, solder portions are formed on some of the land electrodes 9 formed on the lower surface 2b of the substrate 2, and the components 3 and the terminal assemblies 11 are each mounted on a corresponding one of the land electrodes 9 on which the solder portions have been formed. After that, a reflow process is performed. Note that each of the terminal assemblies 11 to be mounted may be replaced with any of the terminal assemblies 11a to 11f as necessary.

Figure 7B:
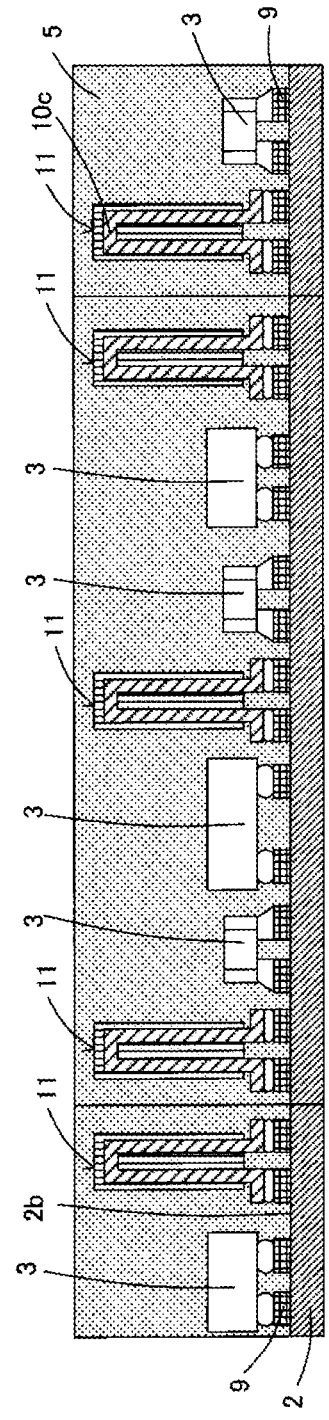

Next, as illustrated in FIG. 7B, the second sealing resin layer 4 and the first sealing resin layer 5 are formed so as to cover the components 3 and the terminal assemblies 11 (11a to 11f) mounted on the upper surface 2a and the lower surface 2b of the substrate 2. For example, these sealing resin layers 4 and 5 can be formed by a transfer molding method, a compression molding method, a liquid-resin method, a sheet-resin method, or the like. In addition, a common epoxy resin containing silica filler can be used for the sealing resin layers 4 and 5. Note that, in order to cause the sealing resin layers 4 and 5 to have a high thermal conductivity, an epoxy resin containing a filler, such as alumina filler that has a high thermal conductivity can also be used. Note that, before the sealing resin layers 4 and 5 are formed, plasma cleaning may be performed on the substrate 2 as necessary.

Figure 8A:
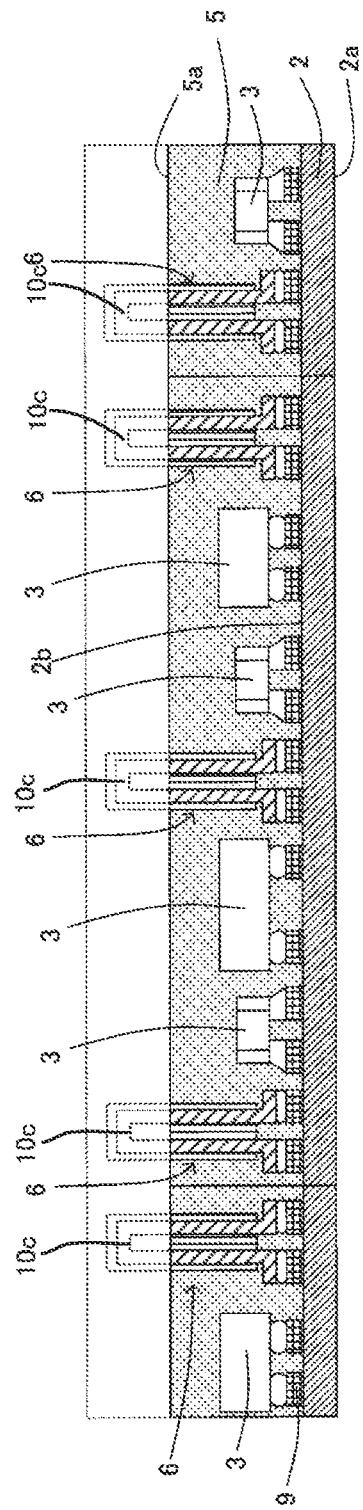
FIGS. 8A and 8B are diagrams illustrating the method for manufacturing the module illustrated in FIGS. 1A and 1B.
Figure 8B:
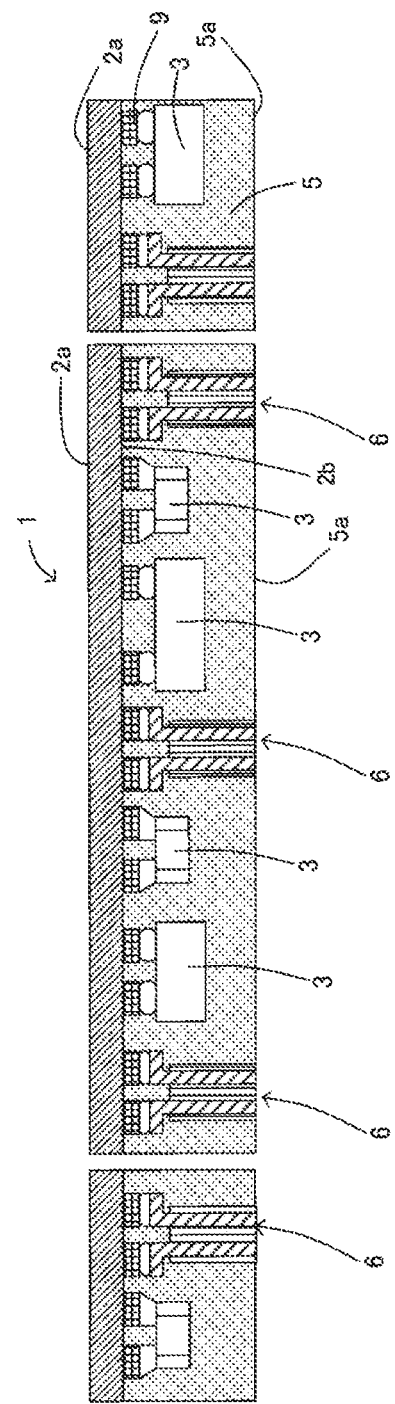

Next, as illustrated in FIG. 8A, polishing or grinding is performed on the lower surface of the first sealing resin layer 5 so as to remove the connecting portions 10c of the terminal assemblies 11 (11a to 11f). After that, as illustrated in FIG. 8B, the aggregate of the plurality of modules 1 is separated into the individual modules 1 by a commonly known method, such as a method using a dicer or laser processing. Subsequently, the shield film 7 is deposited by using a sputtering apparatus or a vacuum deposition apparatus so as to cover the surface of the second sealing resin layer 4, the side surface of the first sealing resin layer 5, and the side surface of the substrate 2, so that manufacture of the module 1 is completed.

According to the above-described embodiment, by preparing the terminal assemblies 11 having various shapes on the basis of the preset standards, the same terminal assemblies 11 can be used for various types of modules. In addition, the terminal assemblies 11 are easy to process and are favorable in terms of mass production, and thus, the manufacturing costs of the module can be reduced. Furthermore, each of the connection conductors 10 includes the substrate connecting portions 10b, so that the connection area between the connection conductors 10 and the substrate 2 can be increased, and the connection reliability between the connection conductors 10 and the substrate 2 can be improved.

Even if the module 1 is increased in size or becomes complex, or the module 1 has a large number of terminals, by preparing the terminal assemblies 11 each having a size and the number of terminals that are easy to handle, the probability of a connection failure occurring due to positional deviation at the time of mounting can be reduced, and the reliability of terminal connection can be improved.

Compared with a structure in which a frame-shaped substrate is mounted on the lower surface 2b of the substrate 2, and a shield film is formed on the inner peripheral surface of the frame-shaped substrate, so that a shielding function for the components mounted on the lower surface 2b of the substrate 2 is obtained, in the structure according to the present disclosure, the probability that warpage that may occur due to, for example, a difference in thermal expansion coefficient between the substrate 2 and a frame-shaped substrate can be reduced, and a decrease in the reliability of a module due to a connection failure of a terminal, breakage of a terminal, or the like can be suppressed. In addition, combining the terminal assemblies 11 each having a shield wall can facilitate formation of a dividing shield or a partial shield, which are difficult to form by using a frame-shaped substrate which makes processing steps complicated.

(Modification of Module)

A modification of the module 1 will be described with reference to FIGS. 9A-9C. Note that FIGS. 9A to 9C are sectional views of modules 1a to 1c.

Figure 9A:
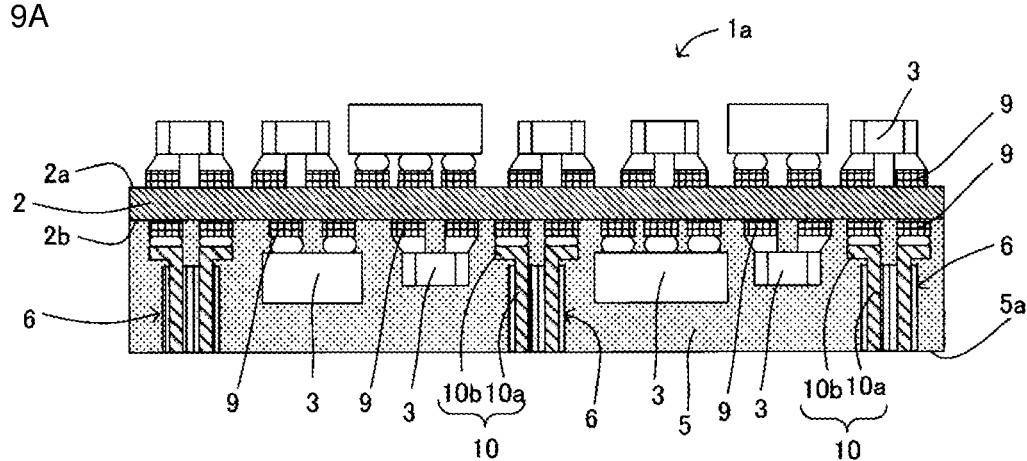
FIGS. 9A, 9B, and 9C are diagrams illustrating a modification of the module illustrated in FIGS. 1A and 1B.
Figure 9B:
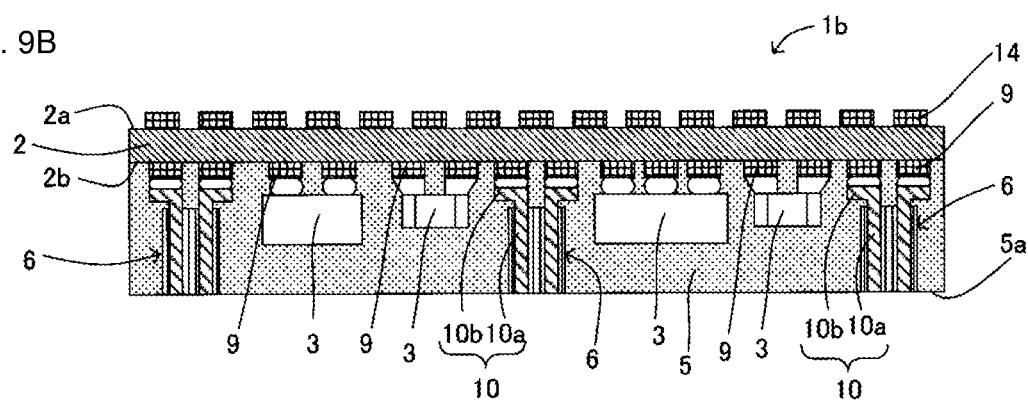
Figure 9C:
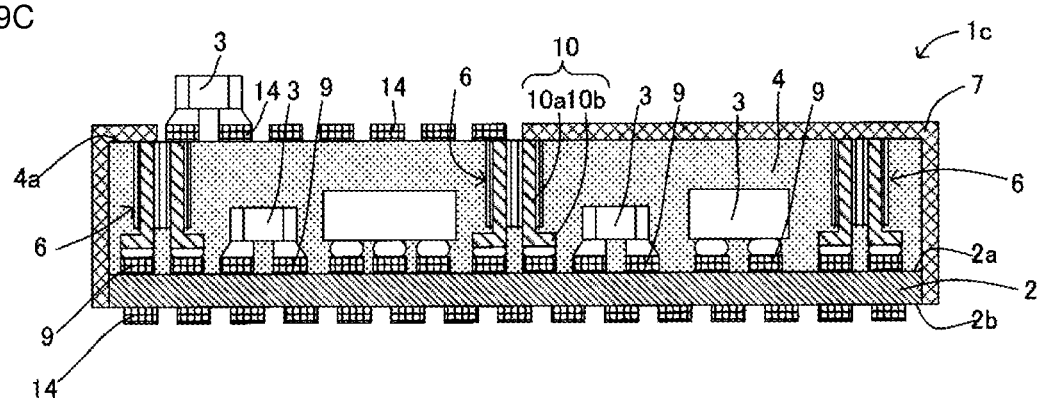

As illustrated in FIG. 9A, in the module 1a, the components 3 are mounted on the upper surface 2a of the substrate 2, and the second sealing resin layer 4 is not formed. As illustrated in FIG. 9B, in the module 1b, a plurality of wiring lines/antenna patterns 14 are formed on the upper surface 2a of the substrate 2 instead of the components 3. As illustrated in FIG. 9C, in the module 1c, the components 3 and the terminal blocks 6 are mounted on the upper surface 2a of the substrate 2, and the wiring lines/external connecting electrodes 14 are formed on the lower surface 2b of the substrate 2. In addition, a surface of the second sealing resin layer 4 has a portion on which the shield film 7 is not formed, and the wiring lines/external connecting electrodes 14 are formed on the portion on which the shield film 7 is not formed. The components 3 may be mounted on the wiring lines/external connecting electrodes 14.

Second Embodiment

Figure 10A:
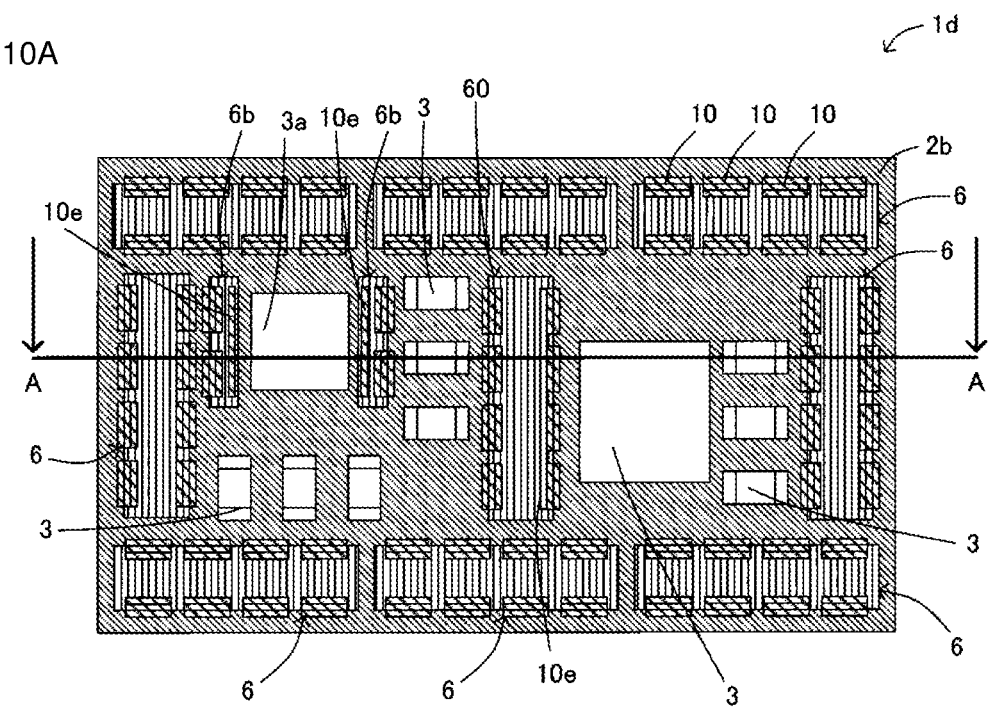
FIG. 10A includes a plan view and FIG. 10B includes a sectional view of a module according to a second embodiment of the present disclosure.
Figure 10B:
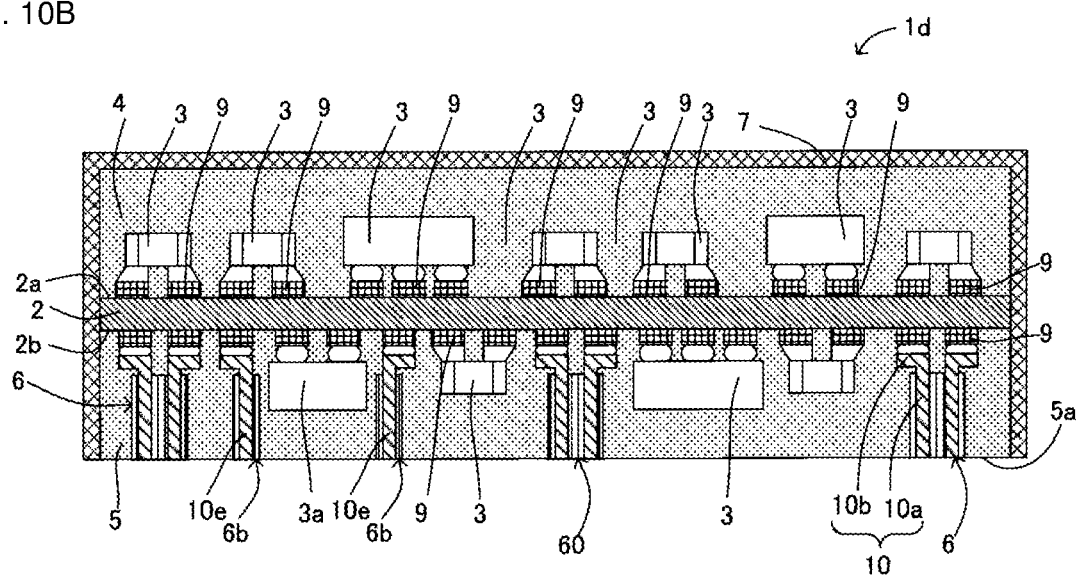
Figure 11A:
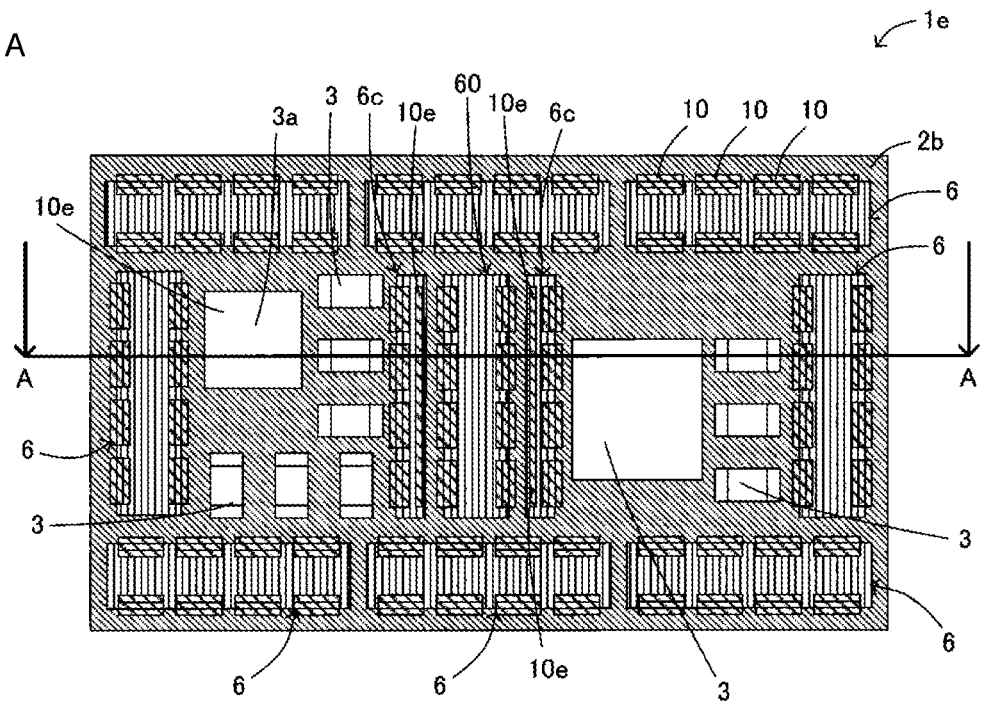
FIG. 11A includes a plan view and FIG. 11B includes a sectional view of a module according to the second embodiment of the present disclosure.
Figure 11B:
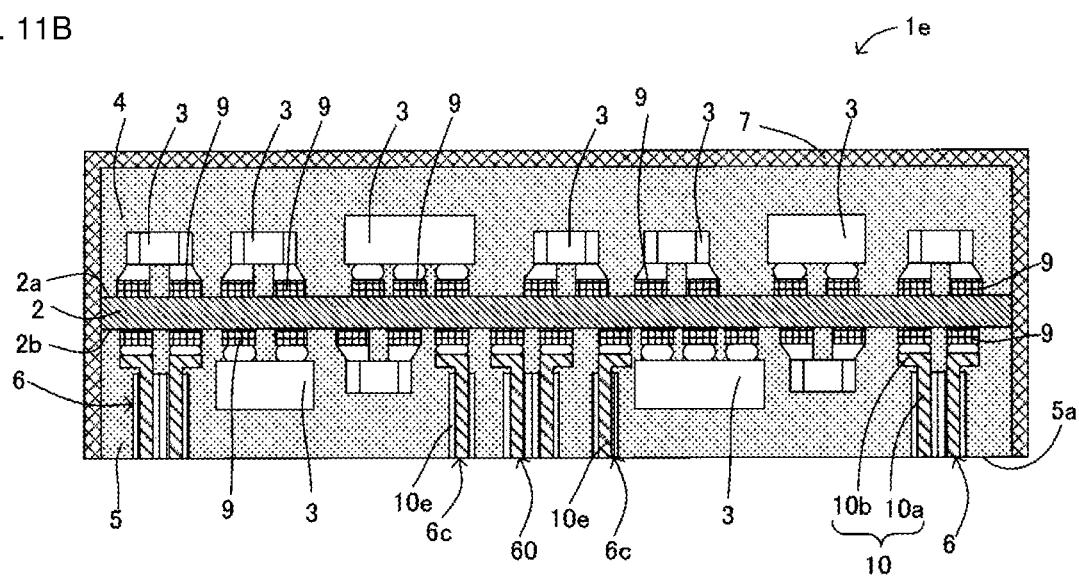

A module 1d and a module 1e according to a second embodiment of the present disclosure will be described with reference to FIG. 10A to FIG. 13B. Note that FIG. 10A is a plan view of the module 1d according to the second embodiment when viewed from a mounting surface side, and FIG. 10B is a sectional view of the module 1d taken along line A-A of FIG. 10A. FIG. 11A is a plan view of the module 1e according to the second embodiment when viewed from a mounting surface side, and FIG. 11B is a sectional view of the module 1e taken along line A-A of FIG. 11A. FIGS. 12A-12B and FIGS. 13A-13B are diagrams illustrating a method for manufacturing the module 1d and the module 1e.

The difference between the modules 1d and 1e according to the second embodiment and the module 1 according to the first embodiment that has been described with reference to FIGS. 1A and 1B is that terminal blocks are arranged so as to sandwich a component or another terminal block therebetween as illustrated in FIGS. 10A-10B and FIGS. 11A-11B. The rest of the configuration of each of the modules 1d and 1e is similar to that of the module 1 according to the first embodiment, and thus, description thereof will be omitted by using the same reference signs.

In the module 1d illustrated in FIGS. 10A-10B, two terminal blocks 6b are arranged so as to sandwich the component 3a, which is mounted on the lower surface 2b of the substrate 2, therebetween. The lower surface 2b of the substrate 2 is divided in two regions by the terminal block 60 that is disposed substantially at the center of the lower surface 2b of the substrate 2 and that includes the shield wall 10e. In addition, each of the terminal blocks 6b also includes the shield wall 10e, and thus, one of the two divided regions can be further divided into smaller regions by these shield walls.

In the module 1e illustrated in FIGS. 11A-11B, two terminal blocks 6c are arranged so as to sandwich the terminal block 60 that is disposed at the center of the lower surface 2b of the substrate 2. Each of the terminal blocks 6c also includes the shield wall 10e, and thus, the terminal blocks 6c can divide the lower surface 2b of the substrate 2 into a terminal region that is located substantially at the center of the lower surface 2b of the substrate 2 (a region in which the terminal block 60 is disposed) and a component region in which the components are arranged.

(Method for Manufacturing Module)

A method for manufacturing the module 1d or the module 1e will be described with reference to FIGS. 12A-12B and FIGS. 13A-13B. Note that the components 3, which are mounted on the upper surface 2a of the substrate 2, and the second sealing resin layer 4 are not illustrated in FIGS. 12A-12B and FIGS. 13A-13B.

Figure 12A:
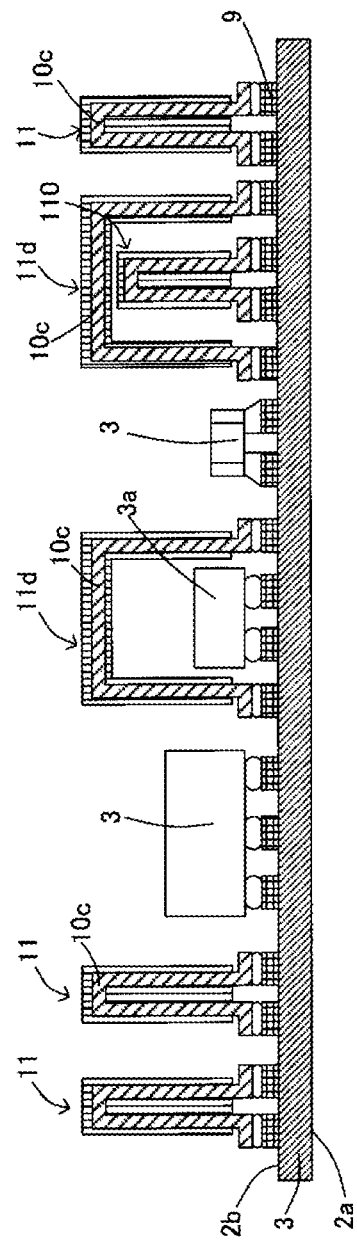
FIGS. 12A and 12B are diagrams illustrating a method for manufacturing the module illustrated in FIGS. 10A and 10B.

First, as illustrated in FIG. 12A, the substrate 2 that has the upper surface 2a and the lower surface 2b, on which the plurality of land electrodes 9 have been formed, and the outer and inner layers, on or in which a plurality of ground electrodes, a plurality of wiring electrodes, a plurality of via conductors, and so forth have been formed, is prepared. The land electrodes 9, the ground electrodes, and the wiring electrodes can each be formed by performing screen-printing using an electrically conductive paste containing a metal, such as Cu, Ag, or Al. Each of the via conductors can be formed by a commonly known method after forming a via hole with a laser or the like. Then, the components 3 are mounted on the upper surface 2a of the substrate 2, and the components 3 and 3a and the terminal assemblies 11, 110, and 11d are mounted on the lower surface 2b by a commonly known surface mount technology. For example, solder portions are formed on some of the land electrodes 9 formed on the lower surface 2b of the substrate 2, and the components 3 and the terminal assemblies 11 are each mounted on a corresponding one of the land electrodes 9 on which the solder portions have been formed. In this case, the terminal assemblies 11d are mounted so as to extend across one of the component 3a and the terminal assembly 110 which has a small height.

Figure 12B:
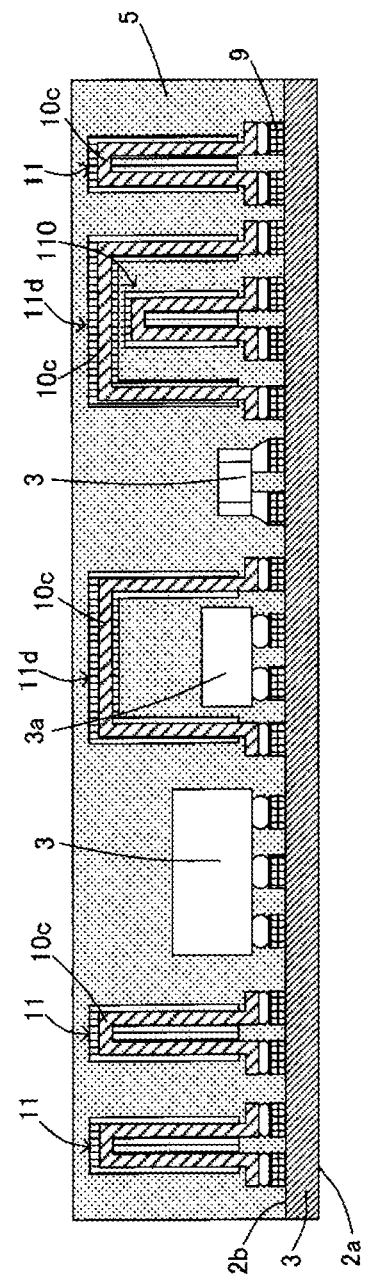

Next, as illustrated in FIG. 12B, the second sealing resin layer 4 and the first sealing resin layer 5 are formed so as to cover the components 3 and 3a and the terminal assemblies 11, 110, and 11d, which are mounted on the upper surface 2a and the lower surface 2b of the substrate 2. For example, these sealing resin layers 4 and 5 can be formed by a transfer molding method, a compression molding method, a liquid-resin method, a sheet-resin method, or the like. In addition, a common epoxy resin containing silica filler can be used for the sealing resin layers 4 and 5. Note that, in order to cause the sealing resin layers 4 and 5 to have a high thermal conductivity, an epoxy resin containing a filler, such as alumina filler that has a high thermal conductivity can also be used. Note that, before the sealing resin layers 4 and 5 are formed, plasma cleaning may be performed on the substrate 2 as necessary.

Figure 13A:
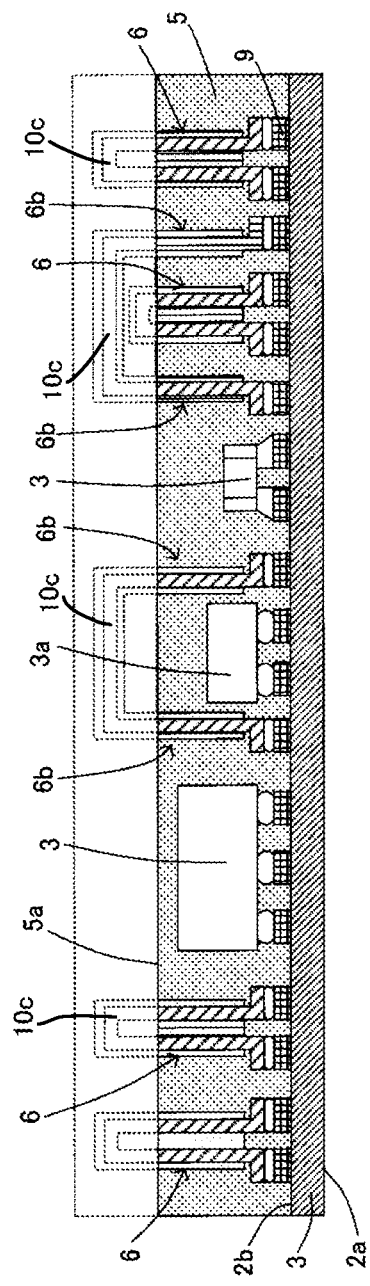
FIGS. 13A and 13B are diagrams illustrating a method for manufacturing the module illustrated in FIGS. 10A and 10B.
Figure 13B:
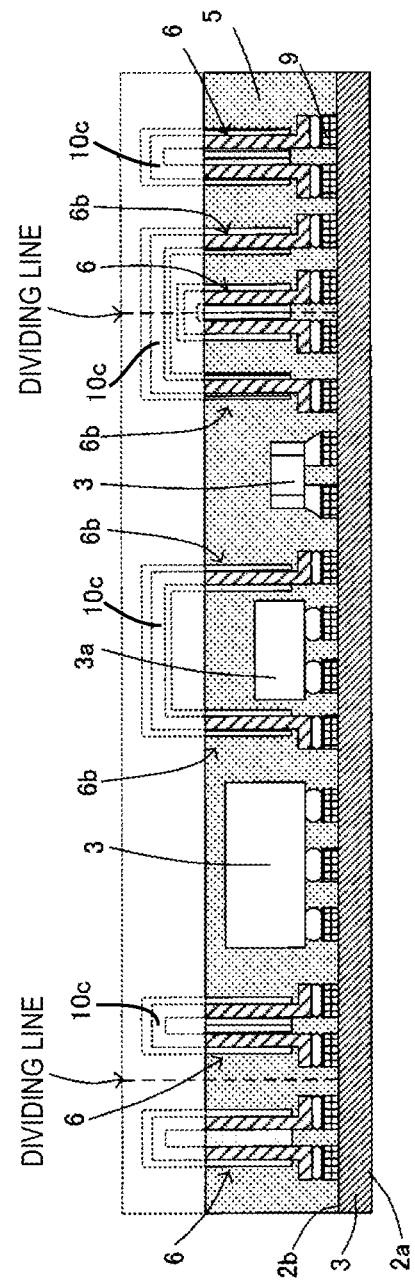

Next, as illustrated in FIG. 13A, polishing or grinding is performed on the lower surface of the first sealing resin layer 5 so as to remove the connecting portions 10c of the terminal assemblies 11, 110, and 11d. After that, as illustrated in FIG. 13B, the aggregate of the plurality of modules 1 is separated into the individual modules 1 by a commonly known method, such as a method using a dicer or laser processing. Subsequently, the shield film 7 is deposited by using a sputtering apparatus or a vacuum deposition apparatus so as to cover the surface of the second sealing resin layer 4, the side surface of the first sealing resin layer 5, and the side surface of the substrate 2, so that manufacture of the module 1d or 1e is completed.

Figure 14A:
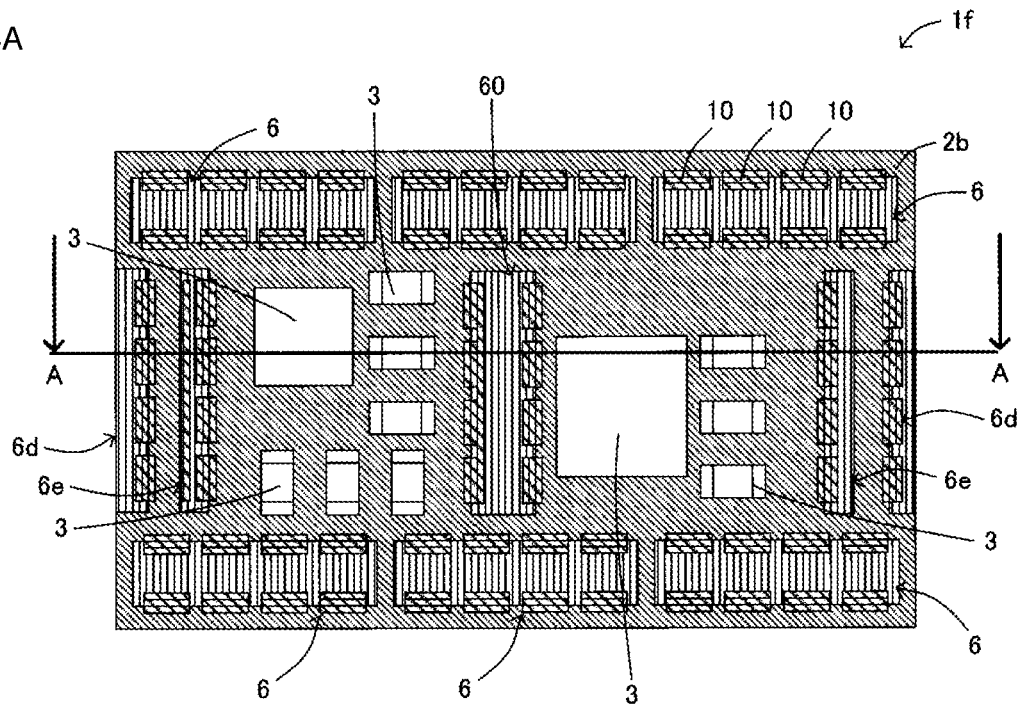
FIGS. 14A and 14B are diagrams illustrating a modification of the module illustrated in FIGS. 10A and 10B.
Figure 14B:
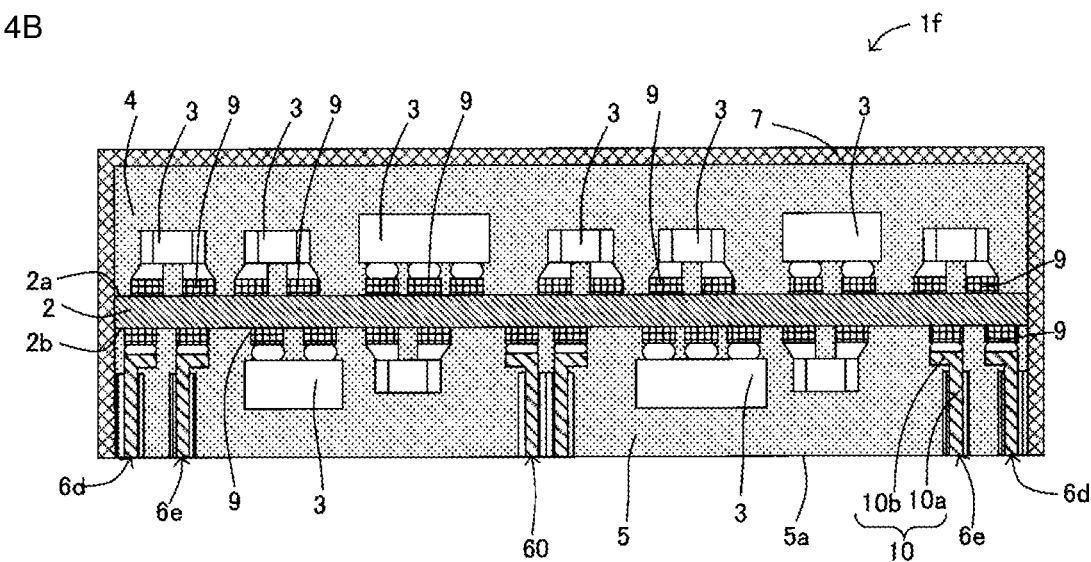
Figure 15:
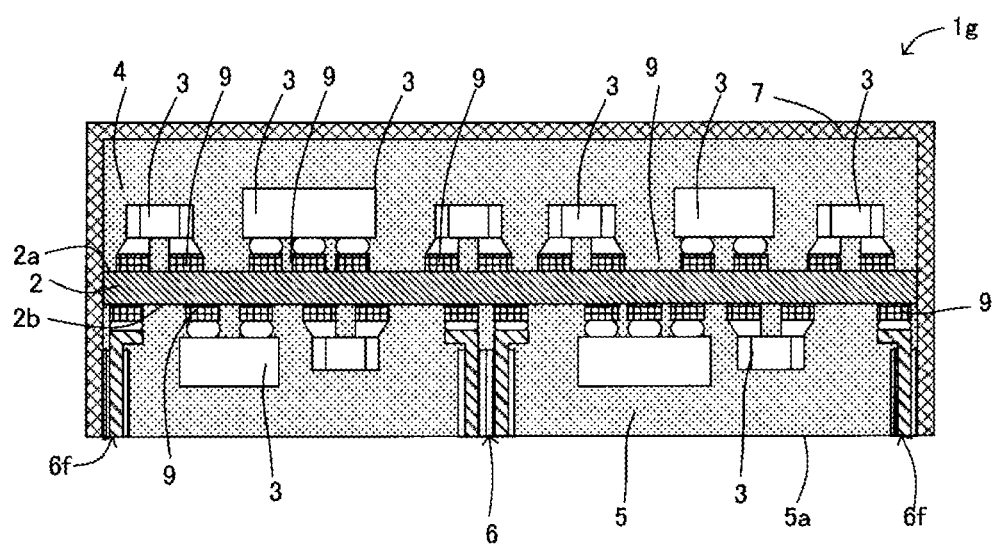
FIG. 15 is a diagram illustrating a modification of the module illustrated in FIGS. 10A and 10B.

Note that the aggregate of the plurality of modules 1 may be separated into the individual modules 1 such that the terminal assemblies 110 and 11d are divided into pieces as illustrated in FIG. 13B. In this case, as in a module if that is illustrated in FIGS. 14A and 14B, terminal blocks 6d that are formed by dividing the terminal assemblies 110 are positioned on end portions of the lower surface 2b of the substrate 2, and terminal blocks 6e that are formed by dividing the terminal assemblies 11d are each positioned so as to be adjacent to one of the terminal blocks 6d. In addition, in the case where the aggregate of the plurality of modules 1 is separated into the individual modules 1 such that the terminal assemblies 11 are divided into pieces, as in a module 1g that is illustrated in FIG. 15, terminal blocks 6f that are formed by dividing the terminal assemblies 11 are positioned on end portions of the lower surface 2b of the substrate 2.

According to the above-described second embodiment, by arranging terminal blocks each having a shield wall on the lower surface 2b of the substrate 2, the lower surface 2b of the substrate 2 can be divided into small regions.

Third Embodiment

Figure 16A:
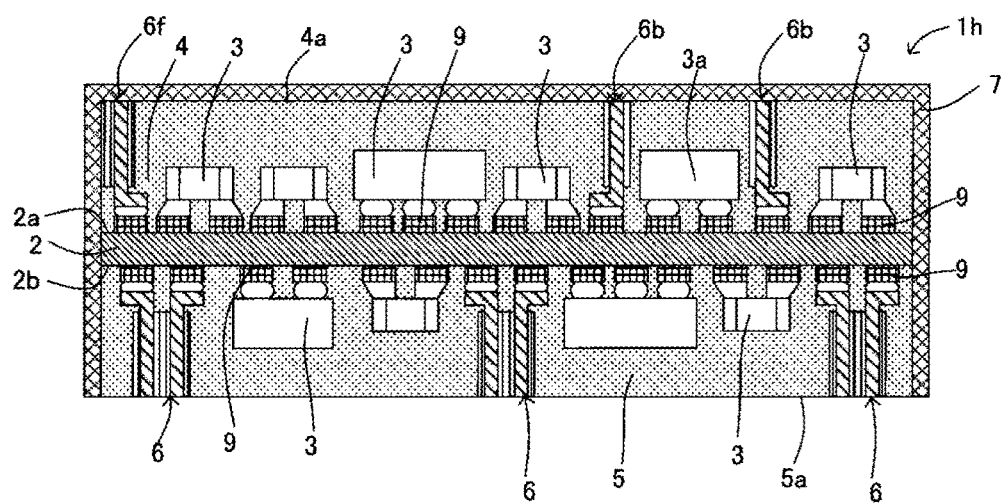
FIGS. 16A, 16B, and 16C are sectional views of a module according to a third embodiment of the present disclosure.
Figure 16B:
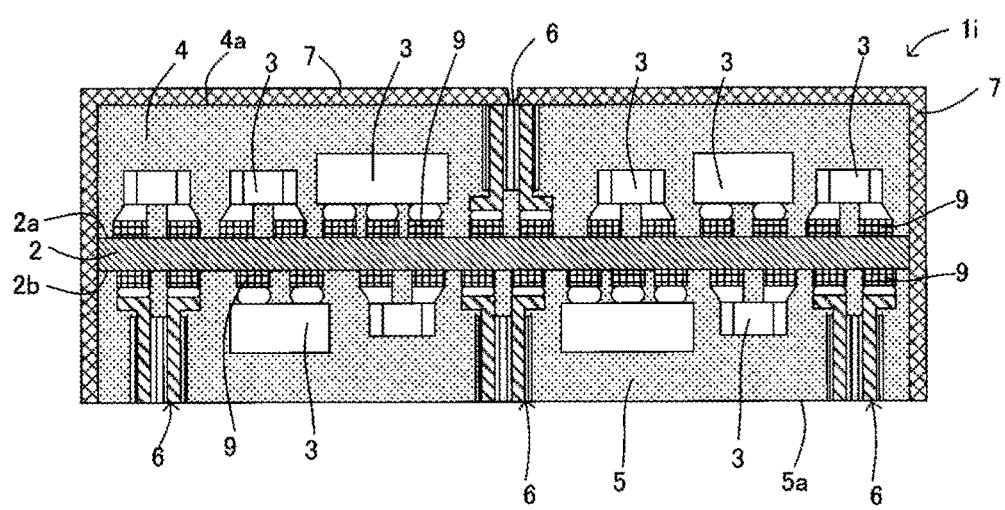
Figure 16C:
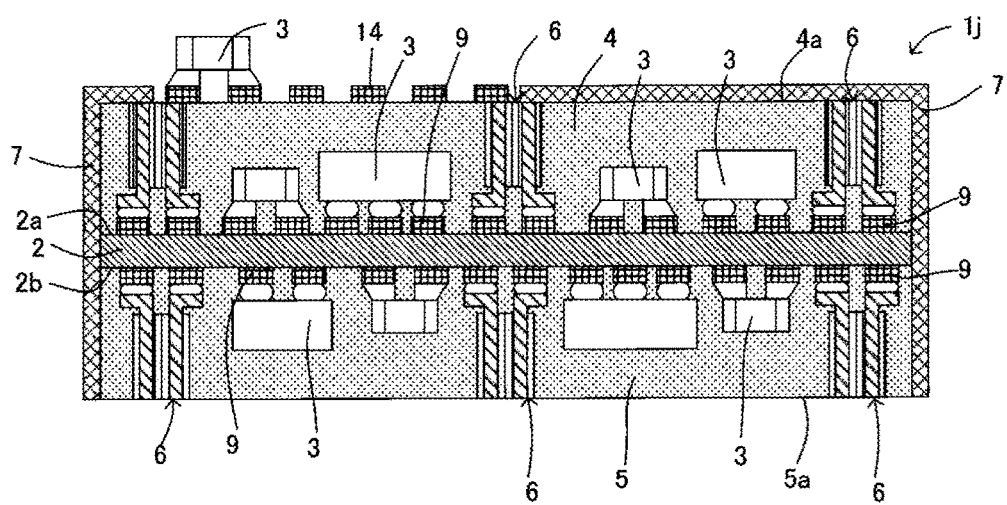
Figure 17A:
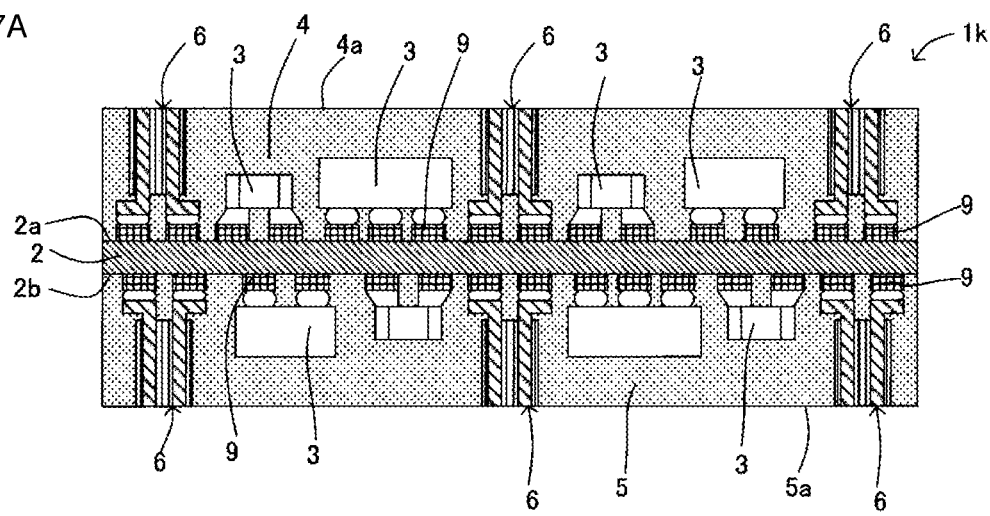
FIGS. 17A and 17B are sectional views of a module according to the third embodiment of the present disclosure.
Figure 17B:
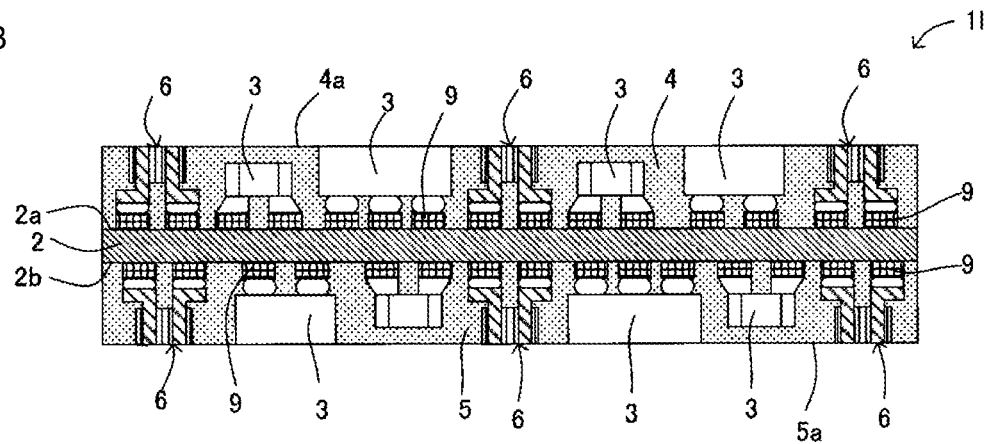
Figure 18A:
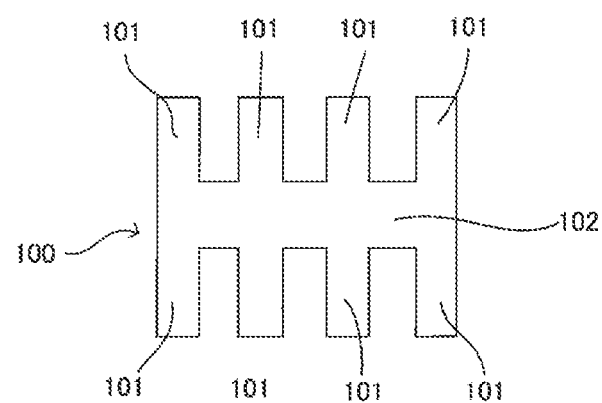
FIGS. 18A and 18B are sectional views of a module of the related art.
Figure 18B:
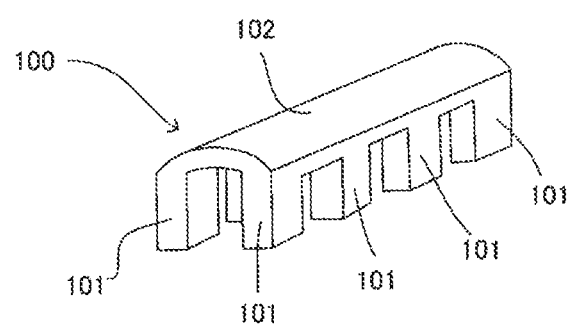

Modules 1h to 1l according to a third embodiment of the present disclosure will be described with reference to FIGS. 16A-16C and FIGS. 17A-17B. Note that FIG. 16A is a sectional view of the module 1h according to the third embodiment. FIG. 16B is a sectional view of the module 1i according to the third embodiment. FIG. 16C is a sectional view of the module 1j according to the third embodiment. FIG. 17A is a sectional view of the module 1k according to the third embodiment. FIG. 17B is a sectional view of the module 1l according to the third embodiment.

The difference between the modules 1h to 1l according to the third embodiment and the module 1 according to the first embodiment that has been described with reference to FIGS. 1A-1B is that the terminal blocks 6 are mounted on both the upper surface 2a and the lower surface 2b of the substrate 2 as illustrated in FIGS. 16A-16C and FIGS. 17A-17B. The rest of the configuration of each of the modules 1h to 1l is similar to that of the module 1 according to the first embodiment, and thus, description thereof will be omitted by using the same reference signs.

As illustrated in FIG. 16A, in the module 1h, terminal blocks 6b and 6f are mounted on the upper surface 2a of the substrate 2, and the terminal blocks 6 are mounted on the lower surface 2b. End portions of the terminal portions 10a of the terminal blocks 6b or 6f mounted on the upper surface 2a of the substrate 2 are exposed at the upper surface 4a of the second sealing resin layer 4 and connected to the shield film 7. Note that the terminal portions 10a of the terminal blocks 6b or 6f may include a shield wall.

As illustrated in FIG. 16B, in the module 1i, end portions of the terminal portions 10a of the terminal block 6 mounted on the upper surface 2a of the substrate 2 are connected to the shield film 7, and the shield film 7 is divided in portions on the upper surface 4a of the second sealing resin layer 4, and a plurality of independent shield regions are formed in association with the terminal block 6.

As illustrated in FIG. 16C, in the module 1j, a portion of the upper surface 4a of the second sealing resin layer 4 is not covered with the shield film 7. The wiring lines/external connecting electrodes 14 are arranged on the portion, and one of the components is mounted on the wiring lines/external connecting electrodes 14. The end portions of the terminal portions 10a of the terminal blocks 6 are connected to antenna patterns.

As illustrated in FIGS. 17A and 17B, in each of the modules 1k, and 1l, the terminal blocks 6 are mounted on the upper surface 2a and the lower surface 2b of the substrate 2, and end portions of the terminal portions 10a of the terminal blocks 6 form external connection terminals. In the module 1k illustrated in FIG. 17A, only the end portions of the terminal portions 10a of the terminal blocks are exposed at the sealing resin layers 4 and 5 and form the external connection terminals, and the module 1l illustrated in FIG. 17B has a configuration in which some of the components 3 are exposed at the sealing resin layers 4 and 5 in order to reduce the height of the module 1l.

According to the above-described third embodiment, a partial shield can be formed on both the upper surface 2a and the lower surface 2b of the substrate 2. In addition, in the case of the configuration illustrated in FIGS. 17A-17B, a partial shield can be formed on both the upper surface 2a and the lower surface 2b of the substrate 2, and in addition, a plurality of modules can be stacked one on top of the other.

Note that the present disclosure is not limited to the above-described embodiments, and various changes other than those described above can be made within the scope of the present disclosure.

INDUSTRIAL APPLICABILITY

The present disclosure can be widely applied to modules in which components are mounted on a substrate and in which a shield is formed between the components.

REFERENCE SIGNS LIST 1, 1a to 1l module
2 substrate
2a upper surface (second main surface)
2b lower surface (first main surface)
3 component
4 second sealing resin layer
5 first sealing resin layer
6, 6b to 6f terminal block
7 shield film
10 connection conductor
10a terminal portion
10b substrate connecting portion
11, 11a to 11f terminal assembly
12 frame portion
13 lead portion

The invention claimed is:

1. A module with a built-in component comprising:
   a substrate;
   a first component and a connection conductor that are mounted on a first main surface of the substrate; and
   a first sealing resin layer that covers the first main surface, the first component, and the connection conductor,
   wherein the connection conductor includes a terminal portion that is vertically arranged in the first sealing resin layer and a substrate connecting portion that comprises a bent end portion of the connection conductor, wherein the terminal portion has an end portion that is exposed at a surface of the first sealing resin layer, and the substrate connecting portion is connected to the first main surface of the substrate, wherein a plurality of the connection conductors are arranged in a row and integrated with one another by a terminal block made of a resin, wherein the substrate connection conductors of the plurality of connection conductors, which are integrated with one another by the terminal block, are arranged so as to be oriented in a same direction, and wherein the first sealing resin layer and said resin of the terminal block are made of different materials.

2. The module with a built-in component according to claim 1, wherein the end portion of the terminal portion is an external connection terminal.

3. The module with a built-in component according to claim 1, wherein a shield film is on the surface of the first sealing resin layer, and the end portion of the terminal portion is connected to the shield film.

4. The module with a built-in component according to claim 1, wherein the plurality of connection conductors, which are integrated with one another by the terminal block, have the terminal portions that are adjacent to each other and that are connected to each other by a planar conductor.

5. The module with a built-in component according to claim 1, wherein a plurality of the terminal blocks are arranged so as to surround the first component.

6. The module with a built-in component according to claim 1, further comprising:

a second component that is mounted on a second main surface of the substrate; and a second sealing resin layer that covers the second main surface and the second component.

7. The module with a built-in component according to claim 1, further comprising:

another connection conductor that is mounted, together with a second component, on a second main surface of the substrate; and a second sealing resin layer that covers the second main surface, the second component, and the other connection conductor, wherein the other connection conductor includes a terminal portion that is vertically arranged in the second sealing resin layer and a substrate connecting portion that comprises a bent end portion the other connection conductor, wherein the terminal portion has an end portion that is exposed at a surface of the second sealing resin layer, and the substrate connecting portion is connected to the second main surface of the substrate, and wherein the end portion of the terminal portion of the connection conductor mounted on the first main surface and the end portion of the terminal portion of the other connection conductor mounted on the second main surface are each an external connection terminal.

8. The module with a built-in component according to claim 7, wherein a plurality of the other connection conductors are arranged in a row and integrated with one another by a terminal block made of a resin, and wherein the substrate connection conductors of the plurality of other connection conductors, which are integrated with one another by the terminal block, are arranged so as to be oriented in a same direction.

9. The module with a built-in component according to claim 8, wherein the plurality of other connection conductors, which are integrated with one another by the terminal block, have the terminal portions that are adjacent to each other and that are connected to each other by a planar conductor.

10. The module with a built-in component according to claim 8, wherein a plurality of the terminal blocks are arranged so as to surround the second component.

11. The module with a built-in component according to claim 1, further comprising:

a second component and another connection conductor that are mounted on a second main surface of the substrate;

a second sealing resin layer that covers the second main surface, the second component, and the other connection conductor; and a shield film on a surface of the first sealing resin layer and a surface of the second sealing resin layer, wherein the other connection conductor includes a terminal portion that is vertically arranged in the second sealing resin layer and a substrate connecting portion that comprises a bent end portion of the other connection conductor, wherein the terminal portion has an end portion that is exposed at the surface of the second sealing resin layer, and the substrate connecting portion is connected to the second main surface of the substrate, and wherein the terminal portion of one of the connection conductor mounted on the first main surface and the other connection conductor mounted on the second main surface has the end portion that is an external connection terminal, and the terminal portion of another one of the connection conductor and the other connection conductor has the end portion that is connected to the shield film.

12. The module with a built-in component according to claim 11, wherein a plurality of the other connection conductors are arranged in a row and integrated with one another by a terminal block made of a resin, and wherein the substrate connection conductors of the plurality of other connection conductors, which are integrated with one another by the terminal block, are arranged so as to be oriented in a same direction.

13. The module with a built-in component according to claim 12, wherein the plurality of other connection conductors, which are integrated with one another by the terminal block, have the terminal portions that are adjacent to each other and that are connected to each other by a planar conductor.

14. The module with a built-in component according to claim 12, wherein a plurality of the terminal blocks are arranged so as to surround the second component.

15. A method for manufacturing a module with a built-in component, the method comprising:

a terminal assembly formation step of forming a terminal assembly in which a plurality of metal members are arranged and integrated with one another by a resin, each of the plurality of metal members including a pair of terminal portions, a substrate connecting portion formed by bending an end portion of the metal member, and a connecting portion connecting end portions of the pair of terminal portions that are not bent;

a mounting step of mounting the terminal assembly and a first component onto a first main surface of a substrate;

a resin layer formation step of forming a sealing resin layer that covers the first main surface of the substrate, the terminal assembly, and the first component; and a polishing step of removing the connecting portions included in the terminal assembly by polishing a surface of the sealing resin layer, wherein the terminal assembly formation step includes
　a lead frame preparation step of preparing a lead frame that includes a pair of frame portions and a plurality of lead portions supported by the pair of frame portions,
　a metal member formation step of forming the plurality of metal members that include the substrate connecting portions and the connecting portions by bending the lead portions of the lead frame,
　a resin sealing step of sealing the plurality of metal members, which are supported by the frame portions, with a resin,
　a frame cutting step of cutting and removing the frame portions, and
　a singulation step of cutting and singulating the plurality of metal members sealed with the resin.

16. The module with a built-in component according to claim 2, further comprising:
　a second component that is mounted on a second main surface of the substrate; and
　a second sealing resin layer that covers the second main surface and the second component.

17. The module with a built-in component according to claim 3, further comprising:
　a second component that is mounted on a second main surface of the substrate; and
　a second sealing resin layer that covers the second main surface and the second component.

18. The module with a built-in component according to claim 4, further comprising:
　a second component that is mounted on a second main surface of the substrate; and
　a second sealing resin layer that covers the second main surface and the second component.

* * * * *

UNITED STATES PATENT AND TRADEMARK OFFICE
CERTIFICATE OF CORRECTION

PATENT NO. : 11,682,597 B2
APPLICATION NO. : 16/923211
DATED : June 20, 2023
INVENTOR(S) : Tadashi Nomura et al.

It is certified that error appears in the above-identified patent and that said Letters Patent is hereby corrected as shown below:

In the Specification

Column 11, Line 14, "in a module if that is" should be -- in a module 1f that is --.

Signed and Sealed this
Seventh Day of May, 2024

Katherine Kelly Vidal
*Director of the United States Patent and Trademark Office*